United States Patent
Hopstaken et al.

(10) Patent No.: US 9,184,322 B2
(45) Date of Patent: Nov. 10, 2015

(54) TITANIUM INCORPORATION INTO ABSORBER LAYER FOR SOLAR CELL

(71) Applicant: INTERNATIONAL BUSINESS MACHINES CORPORATION, Armonk, NY (US)

(72) Inventors: Marinus J. Hopstaken, Carmel, NY (US); David B. Mitzi, Mahopac, NY (US); Wei Wang, Yorktown Heights, NY (US); Mark T. Winkler, New York, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 259 days.

(21) Appl. No.: 14/013,827

(22) Filed: Aug. 29, 2013

(65) Prior Publication Data
US 2015/0059855 A1    Mar. 5, 2015

(51) Int. Cl.
*H01L 31/032* (2006.01)
*H01L 31/18* (2006.01)

(52) U.S. Cl.
CPC ........ *H01L 31/0327* (2013.01); *H01L 31/1864* (2013.01); *H01L 31/1872* (2013.01)

(58) Field of Classification Search
CPC .................................................. H01L 31/0326
See application file for complete search history.

(56) References Cited

U.S. PATENT DOCUMENTS

| | | | |
|---|---|---|---|
| 8,426,241 B2 | 4/2013 | Ahmed et al. | |
| 2011/0308579 A1 | 12/2011 | Yun | |
| 2012/0067408 A1 | 3/2012 | Hotz et al. | |
| 2012/0097234 A1 | 4/2012 | Bojarczuk et al. | |
| 2012/0100660 A1 | 4/2012 | Hagedorn et al. | |
| 2012/0231276 A1 | 9/2012 | Chane-Ching et al. | |
| 2013/0217211 A1 | 8/2013 | Chawla et al. | |

FOREIGN PATENT DOCUMENTS

WO    WO2011030055 A1    3/2011

OTHER PUBLICATIONS

Non-Final Office Action for U.S. Appl. No. 14/036,255 mailed on Mar. 11, 2015.
Marsen, B., et al. "Effects of Ti-Incorporation in CuInS2 Solar Cells" Solar Energy Materials and Solar Cells, vol. 94, No. 10. Oct. 2010. pp. 1730-1733.
Repins, I., et al. "CO-Evaporated Cu2ZnSnSe4 Films and Devices" Solar Energy Materials & Solar Cells, vol. 101. Jun. 2012. pp. 154-159.
Shin, B., et al. "Control of an Interfacial MoSe2 Layer in Cu2ZnSnSe4 Thin Film Solar Cells: 8.9% Power Conversion Efficiency With a Tin Diffusion Barrier" Applied Physics Letters, vol. 101, Issue 5. Jul. 2012. pp. 1-4.

(Continued)

*Primary Examiner* — Nathan T Leong
(74) *Attorney, Agent, or Firm* — Tutunjian & Bitetto, P.C.

(57) ABSTRACT

A method for fabricating a photovoltaic device includes forming a film including titanium on a conductive layer formed on a substrate. An absorber layer is formed including a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (CZTS) on the film. The absorber layer is annealed to diffuse titanium therein and to recrystallize the CZTS material of the film. A buffer layer is formed on the absorber layer, and a transparent conductive layer is formed on the buffer layer.

15 Claims, 10 Drawing Sheets

(56) References Cited

OTHER PUBLICATIONS

Shin, B., et al. "High Efficiency Cu2ZnSnSe4 Solar Cells With a Tin Diffusion Barrier on the Molybdenum Bottom Contact" Photovoltaic Specialists Conference (PVSC), 2012 38th IEEE. Jun. 2012. pp. 671-673.

Shin, B., et al. "Thin Film Solar Cell With 8.4% Power Conversion Efficiency Using an Earth-Abundant Cu2ZnSnS4 Absorber" Progress in Photovoltaics: Research & Applications, vol. 21, Issue 1. Jan. 2013. pp. 72-76.

Todorov, T., et al. "Beyond 11% Efficiency: Characteristics of State-of-the-Art Cu2ZnSn(S,Se) 4 Solar Cells" Advanced Energy Materials, vol. 3, Issue 1. Jan. 2013. pp. 34-38.

Werth, A., et al. "CuIn(Ga)Se2 Based Thin Film Solar Cells With Electrodeposited Absorber on Flexible Steel Foils" Photovoltaic Specialists Conference (PVSC), 2011 37th IEEE. Jun. 2011. pp. 1375-1379.

TITANIUM INCORPORATION INTO ABSORBER LAYER FOR SOLAR CELL

BACKGROUND

1. Technical Field

The present invention relates to photovoltaic devices and fabrication methods, and more particularly to earth-abundant photovoltaic material having a titanium doped absorber layer.

2. Description of the Related Art $Cu_2ZnSnS_xSe_{4-x}$ (CZTS) is a promising earth-abundant photovoltaic material for high-efficiency thin film solar cells. A power conversion efficiency (PCE) of 11.1% has been achieved by Teodor K. Todorov, et al. using a hydrazine-assisted solution approach (Adv. Energy Mater. 3, 34-38, 2013). Other vacuum-based and non-vacuum-based deposition techniques have also been successfully utilized to fabricate CZTS solar cells with PCE above 9%. However, it is very difficult to achieve an efficiency above 11%, and the PCE of CZTS solar cells is still far below the physical limit, known as the Shockley-Queisser (SQ) limit, of about 29% under terrestrial conditions.

One fundamental reason for the relatively low performance of CZTS solar cells is the large $V_{OC}$ deficit of CZTS devices. $V_{OC}$ deficit refers to the fact that $V_{OC}$ (open circuit voltage) is smaller than expected (e.g., a large $V_{OC}$ deficit corresponds to a smaller-than-expected $V_{OC}$). $V_{OC}$ deficit is defined as $Eg/q - V_{OC}$, where $Eg/q$ is the band gap expressed in volts (q is the fundamental charge). Thus far, no effective method exists that solves the high $V_{OC}$ deficit issue.

SUMMARY

A method for fabricating a photovoltaic device includes forming a film including titanium on a conductive layer formed on a substrate. An absorber layer is formed including a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (CZTS) on the film. The absorber layer is annealed to diffuse titanium therein and to recrystallize the CZTS material of the film. A buffer layer is formed on the absorber layer, and a transparent conductive layer is formed on the buffer layer.

Another method for fabricating a photovoltaic device includes forming a conductive layer on a substrate; forming an absorber layer including a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (CZTS) on the conductive layer; doping the absorber layer with titanium; annealing the absorber layer to recrystallize the CZTS material of the film; forming a buffer layer on the absorber layer; and forming a transparent conductive layer on the buffer layer.

A photovoltaic device includes a substrate having a metal coating thereon. An absorber layer is formed on the metal coating. The absorber layer includes a titanium-doped Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (CZTS), wherein an atomic percentage of titanium included in the absorber layer ranges from about 0 to about 0.125. A buffer layer is formed on the absorber layer, and a transparent conductor is formed on the buffer layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
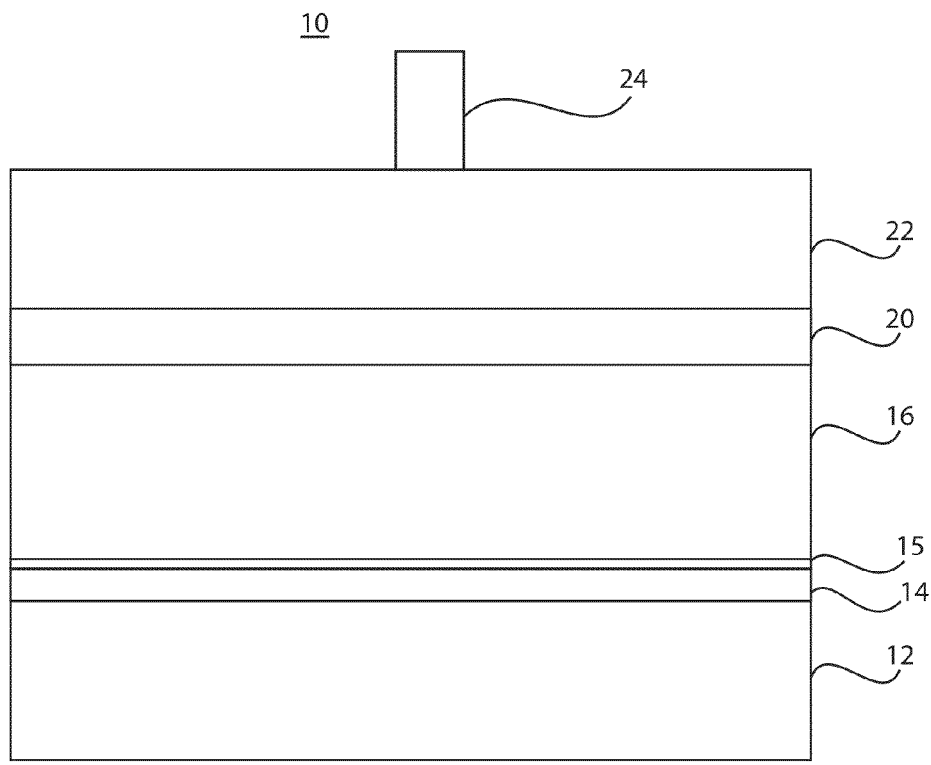
FIG. 1 is a cross-sectional view of a photovoltaic device having a titanium layer on which an absorber layer is formed in accordance with the present principles.

The present principles provide methods and structures that improve open circuit voltage ($V_{OC}$) deficits by incorporating elemental titanium into $Cu_2ZnSnS_xSe_{4-x}$ (CZTS) crystals, films and devices. This improves $V_{OC}$ and power conversion efficiency (PCE) of CZTS solar cells. In one embodiment, a molybdenum-coated substrate is employed. Elemental titanium is introduced into CZTS films by either depositing a titanium layer between CZTS and the Mo-coated substrate or doping elemental titanium into CZTS films. CZTS films can be deposited by various deposition techniques on Mo or Mo/Ti films. An n-type semiconductor film may be deposited on top of CZTS to form a p-n heterojunction diode. A transparent conductor may be formed on the n-type semiconductor with a metallic top contact (e.g., Ni/Al). The present embodiments also include an improved CZTS photovoltaic device, with an efficiency over 11%, which is prepared using the methods described herein for achieving better $V_{OC}$ performance.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe), etc. The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. In addition, other elements may be included in the compound, such as, e.g., dopants and crystallization promoters, including but not limited to sodium (Na) and antimony (Sb), and still function in accordance with the present principles. Compositions may optionally include Ge replacing some or all of the Sn, Ag replacing some or all of the Cu, Cd replacing some or all of the Zn, and that may also include dopants, such as, e.g., Sb, Bi, Na, K, Li, Ca, etc. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed in a tandem (multi-junction) structure. Other architectures, structures, substrate materials and process features and steps may be varied within the scope of the present invention. The tandem structure may include one or more stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a method for forming a photovoltaic structure 10 in accordance with the present principles will be described. The photovoltaic structure 10 may be employed in solar cells, light sensors, photosensitive devices or other photovoltaic applications. The structure 10 includes a substrate 12. The substrate 12 may include glass or other inexpensive substrate material, such as metal, plastic or other material suitable for photovoltaic devices (e.g., quartz, silicon, etc.). A conductive layer 14 is formed on the substrate 12. The conductive layer 14 may include molybdenum although other high work-function materials may be employed (e.g., W, Pt, Au, etc.). The layer 14 provides a metal contact. The conductive layer preferably includes Mo.

A metal film 15 is deposited on the conductive layer 14 by, e.g., a physical vapor deposition (PVD) process (e.g., sputtering, evaporation, etc.). The film 15 preferably includes Ti. A thickness of the film 15 impacts the amount of titanium available for incorporation into a CZTS absorber layer 16 to be formed. A Ti layer thickness of between about 0.5 nm and about 500 nm may be employed, preferably, between about 5 nm and about 50 nm. The atomic percentage of titanium included in the absorber layer 16 ranges from about 0 to about 0.125.

The film 15 should be substantially free of any impurities that can adversely affect solar cell performance. Impurities that are known to degrade device performance are iron (Fe) and nickel (Ni), but other foreign transition metal elements may also serve as recombination centers and thereby reduce solar cell performance. Generally, the film 15 needs to be prepared from a Ti source that has a purity of 99% or better. More preferably, the purity should be 99.9% or better. Optionally, the film 15 may include elements that are known to be beneficial to device performance. For example, Na or Sb are known to be beneficial for device performance and may be co-deposited with the film 15 in a back layer, such that it can distribute the Na and/or Sb into the CZTS layer 16 during the film formation process and therefore improve device performance.

An absorber layer 16 is formed on the film 15 and includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (hereinafter CZTS), although other $I_2$-II-IV-$VI_4$ semiconductors may be employed. Although the major elements in CZTS are Cu, Zn, Sn, S, Se, reference to CZTSSe or Cu—Zn—Sn containing chalcogenide material also includes compositions that optionally include Ge replacing some or all of the Sn, Ag replacing some or all of the Cu, Cd replacing some or all of the Zn, and that may also include other dopants, including Sb, Bi, Na, K, Li, Ca, etc.

In a particularly useful embodiment, the Cu—Zn—Sn-containing chalcogenide includes $Cu_2ZnSn(S,Se)_4$. In one embodiment, the CZTS film or layer 16 has a thickness of between about 0.5 microns to about 5 microns. Layer 16 may be deposited on the film 15 by any vacuum- or solution-based deposition method (e.g., painting, sputtering, co-evaporation, electroplating, spin coating, slit casting, doctor blading, dip coating or other simple coating processes). As-prepared CZTS films are subject to annealing under a controlled environment to produce recrystallized CZTS films.

A controlled environment is employed to react Ti from film 15 with the CZTS film 16. The controlled environment and reaction is one important factor for ultimate device performance. The atmosphere used can be a chemically inert environment, such as under nitrogen, helium or argon, or it can be a reactive environment, such as one containing sulfur vapor, selenium vapor, hydrogen sulfide, hydrogen selenide, a volatile sulfur-containing compound, a volatile selenium-containing compound, a forming gas, etc. Volatile sulfur-containing compounds may include metal sulfides, carbon disulfide, thiourea, thioacetamide and organic thiol compounds. Volatile selenium compounds may include metal selenides, carbon diselenide, selenourea and organic selenol compounds.

A temperature profile for the reaction/CZTS recrystallization step needs to be controlled, as well. Heating may be provided by a laboratory furnace, tube furnace, rapid thermal processing tool, hot plate, or by other methods known by those skilled in the art. The temperature during the heating step may be between about 300° C. and about 800° C. More preferably, the temperature is between about 550° C. and about 650° C.

A buffer layer 20 may be formed on layer 16. The buffer layer 20 may include CdS, which forms a high quality junction with layer 16, although other materials may be employed, including but not limited to $Zn(O,S)$, $ZnO$, $In_2S_3$, $(Cd, Zn)S$. The buffer layer 20 may include an n-type CdS film formed on CZTS of layer 16 by a chemical bath deposition. The buffer layer 20 may include one or more sublayers. For example, the buffer layer may include distinct sublayers of CdS and intrinsic zinc oxide.

A transparent conductive layer 22 is formed over layer 16 or the buffer layer 20, if present. The transparent conductive layer 22 may include a transparent conductive oxide (TCO), such as, e.g., aluminum doped zinc oxide (AZO), boron doped zinc oxide (BZO), indium tin oxide (ITO) or other TCO materials or combinations thereof.

The deposition process for forming the transparent conductive layer 22 may include a sputtering process, an evaporation process, a low temperature plasma enhanced chemical vapor deposition (PECVD) process or other suitable deposition process. The transparent conductive layer 22 forms a light receiving electrode for the device.

Metal contacts 24, e.g., a Ni/Al multilayer, may be formed on the transparent conductive layer 22 to further enhance the conductive properties of the transparent conductive layer 22. An additional anti-reflection coating (ARC) (not shown) may also be formed on top of the device 10.

Figure 2:
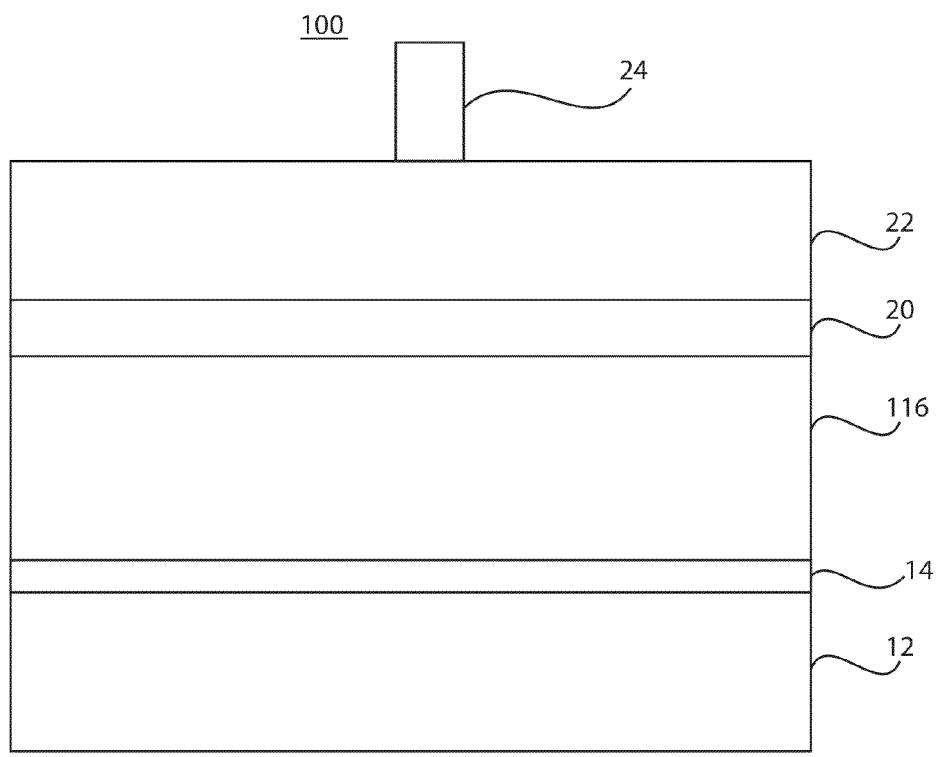
FIG. 2 is a cross-sectional view of a photovoltaic device having an absorber layer doped with titanium in accordance with the present principles.

Referring to FIG. 2, in another embodiment, the conductive layer 14 (e.g., Mo coating on substrate 12) is provided on a photovoltaic structure 100. An absorber layer 116 is deposited on the conductive layer 14 by any vacuum- or solution-based deposition method. In this embodiment, the absorber layer 116 includes Ti as a constituent. In particularly useful embodiments, the atomic percentage of titanium included in the absorber layer 116 ranges from about 0 to about 0.125.

The absorber layer 116 includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (hereinafter CZTS), although other $I_2$-II-IV-$VI_4$ semiconductors may be employed. Although the major elements in CZTS are Cu, Zn, Sn, S, Se, reference to CZTSSe or Cu—Zn—Sn containing chalcogenide material also includes compositions that optionally include Ge replacing some or all of the Sn, Ag replacing some or all of the Cu, Cd replacing some or all of the Zn, and that may also include other dopants, including Sb, Bi, Na, K, Li, Ca, etc.

In a particularly useful embodiment, the Cu—Zn—Sn-containing chalcogenide includes $Cu_2ZnSn(S,Se)_4$. In one embodiment, the CZTS film or layer 116 has a thickness of between about 0.5 microns to about 5 microns.

For vacuum-based deposition methods, titanium metal can be incorporated into source metal materials or target metal materials which include copper, zinc and tin metals. For solution-based deposition methods, titanium metal or compounds can be dissolved into precursor solutions which include copper, zinc, tin and chalcogens to form CZTS.

Vacuum-based deposition methods for layer 116 may include co-evaporation, sputtering, laser ablation, flash evaporation and other techniques known by those skilled in the art. As an example, for co-evaporation, independent elemental Cu, Zn, Sn, Ti, S and Se Knudsen-type sources may be used. The substrate 12 may be maintained at relatively low temperature (e.g., about 150 degrees C.) during film deposition thereby needing a short, e.g., from about 5 min to about 15 min, post deposition heat treatment at a high temperature, e.g., from about 550 degrees C. to about 650 degrees C., to complete the film processing. Alternatively, the substrate 12 can be maintained at high temperature during the growth process, in which case it is possible to avoid the need for a high-temperature post-deposition heat treatment.

Solution-based approaches for forming layer 116 may include a hydrazine-assisted method, metal nanoparticles, binary chalcogenide nanoparticles, ternary chalcogenide nanoparticles, quaternary metal salt solutions, electrodeposition, hydrothermal methods, and other techniques known by those skilled in the art. As an example, for the hydrazine-assisted method, elemental Cu, Zn, Sn, Ti or Ti-containing compounds, S and Se powders may be dissolved or dispersed in pure hydrazine. An obtained colloid solution may be deposited on the conductive layer 14 by spin casting, followed by a post deposition heat treatment at high temperature, e.g., from about 550 degrees C. to about 650 degrees C., to complete the film processing. Ti-containing compounds may include elemental titanium, titanium halides, titanium chalcogenides, titanium oxide, titanium isopropoxide, Ammonium bis(oxalato)oxotitanate(IV) and other organic titanium-containing compounds.

As-prepared CZTS films are subject to annealing under a controlled environment to produce recrystallized CZTS films. The atmosphere used can be a chemically inert environment, such as under nitrogen, helium or argon, or it can be a reactive environment, such as one containing sulfur vapor, selenium vapor, hydrogen sulfide, hydrogen selenide, a volatile sulfur-containing compound, a volatile selenium-containing compound, a forming gas, etc. Volatile sulfur-containing compounds may include metal sulfides, carbon disulfide, thiourea, thioacetamide and organic thiol compounds. Volatile selenium compounds may include metal selenides, carbon diselenide, selenourea and organic selenol compounds.

A temperature profile for the CZTS recrystallization step needs to be controlled. Heating may be provided by a laboratory furnace, tube furnace, rapid thermal processing tool, hot plate, or by other methods known by those skilled in the art. The temperature during the heating step may be between about 300° C. and about 800° C. More preferably, the temperature is between about 550° C. and about 650° C.

The buffer layer 20 may be formed on layer 116. The buffer layer 20 may include CdS, which forms a high quality junction with layer 116, although other materials may be employed, including but not limited to Zn(O,S), ZnO, $In_2S_3$, (Cd, Zn)S. The buffer layer 20 may include an n-type CdS film formed on CZTS of layer 16 by a chemical bath deposition. The buffer layer 20 may include one or more sublayers. For example, the buffer layer may include distinct sublayers of CdS and intrinsic zinc oxide.

The transparent conductive layer 22 is formed over layer 116 or the buffer layer 20, if present. The transparent conductive layer 22 may include a transparent conductive oxide (TCO), such as, e.g., aluminum doped zinc oxide (AZO), boron doped zinc oxide (BZO), indium tin oxide (ITO) or other TCO materials or combinations thereof.

The deposition process for forming the transparent conductive layer 22 may include a sputtering process, an evaporation process, a low temperature plasma enhanced chemical vapor deposition (PECVD) process or other suitable deposition process. The transparent conductive layer 22 forms a light receiving electrode for the device.

Metal contacts 24, e.g., Ni/Al, may be formed on the transparent conductive layer 22 to further enhance the conductive properties of the transparent conductive layer 22. An additional anti-reflection coating (ARC) (not shown) may also be formed on top of the device 100.

In accordance with the present principles, a Ti-substituted absorber is employed to improve open circuit voltage and power conversion efficiency (PCE). The following are non-limiting illustrative examples describing implementations of exemplary embodiments.

Example 1

For making Ti-free devices, solution A (3.3M $Cu_2S$) was made by dissolving Cu and S in hydrazine. Similarly, Sn and Se were stirred in hydrazine to form slurry B (1.5 M $SnSe_3$); Solution A and slurry B were mixed together and transferred to a vial containing zinc formate, yielding solution C with final composition Cu/(Zn+Sn)=0.8, Zn/Sn=1.22 and nominal kesterite CZTSSe concentration of approximately 0.4 M. The thin film CZTS absorber layer with final thickness of 2-2.5 microns was prepared by spin coating this mixture over six consecutive layers at 600 rpm and then subsequently subjecting it to a short anneal on a ceramic hot plate with a set point of 630 degrees C.

The CdS buffer, ZnO window, and indium doped tin oxide (ITO) layers were subsequently deposited by chemical bath deposition and RF magnetron sputtering, respectively, giving a CZTSSe device structure with a device area of approximately 0.45 $cm^2$, as defined by mechanical scribing. A Ni/Al collection grid and 110-nm-thick $MgF_2$ antireflection coating were deposited on top of the device by electron-beam evaporation. Example 1 describes a preparation and characteristics of a CZTS solar cell without Ti (graph 204) having a PCE equal to 10.03% shown in FIG. 8.

Example 2

For making Ti-incorporating devices, a solution A (3.3M $Cu_2S$) was made by dissolving Cu and S in hydrazine. Similarly, Sn and Se were stirred in hydrazine to form slurry B (1.5 M $SnSe_3$); Solution A and slurry B were mixed together and transferred to a vial containing zinc formate, yielding solution C with final composition Cu/(Zn+Sn)=0.8, Zn/Sn=1.22 and nominal kesterite CZTSSe concentration of approximately 0.4 M. A 20 nm titanium thin film was deposited on molybdenum-coated glass by electron-beam evaporation. The Ti- and Mo-coated glass was used as a substrate for CZTS deposition.

The thin film CZTS absorber layer with final thickness of 2-2.5 microns was prepared by spin coating this mixture over six consecutive layers at 600 rpm and then subsequently subjecting it to a short anneal on a ceramic hot plate with a set point of 630 degrees C. The CdS buffer, ZnO window, and indium doped tin oxide (ITO) layers were subsequently deposited by chemical bath deposition and RF magnetron sputtering, respectively giving a CZTSSe device structure with a device area of approximately 0.45 $cm^2$, as defined by mechanical scribing. A Ni/Al collection grid and 110-nm-thick $MgF_2$ antireflection coating were deposited on top of the device by electron-beam evaporation. Example 2 describes a preparation and characteristics of a Ti-incorporated CZTS solar cell (graph 202) having a PCE equal to 11.14% shown in FIG. 8.

Figure 3:
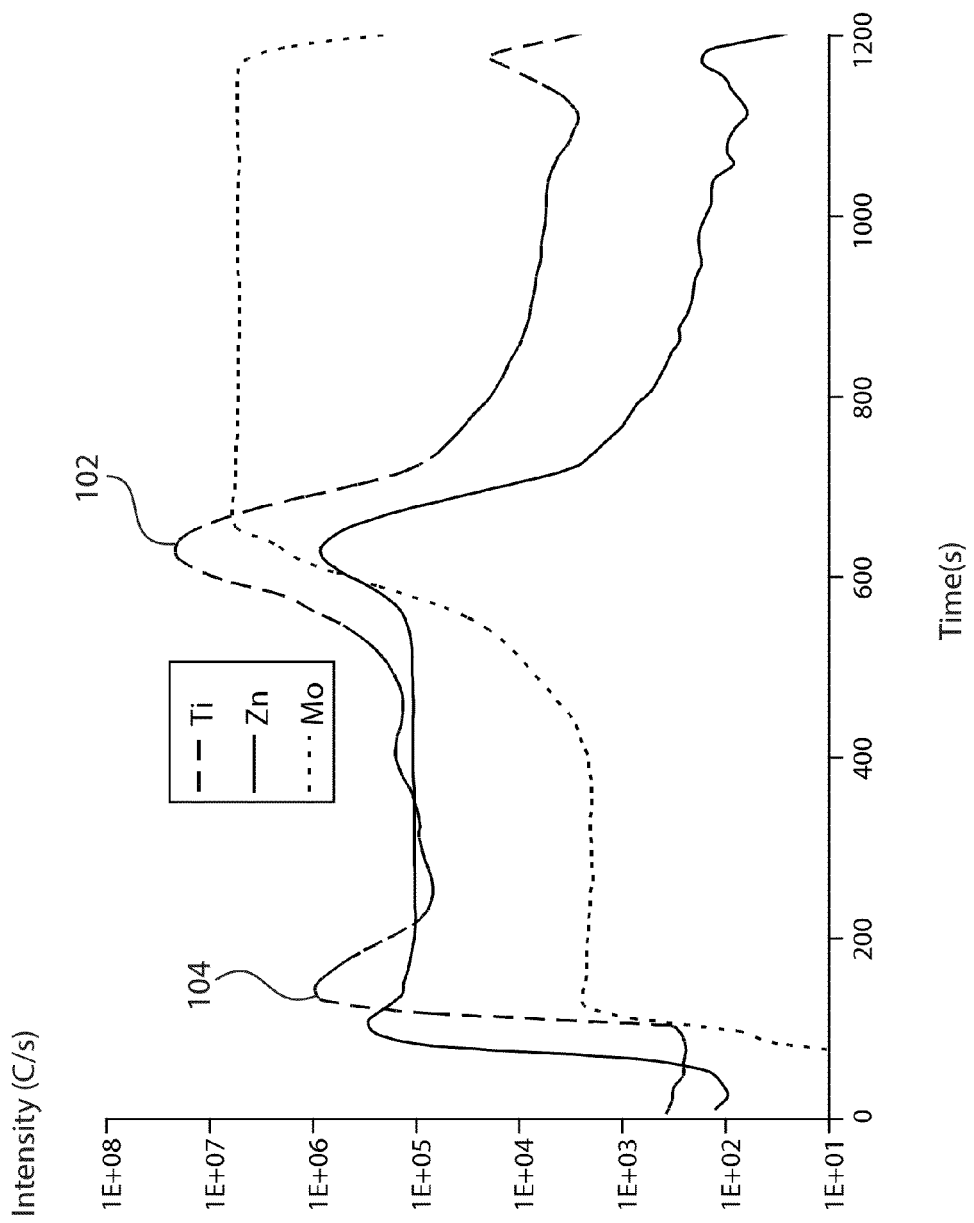
FIG. 3 is a graph of SIMS (secondary ion mass spectrometry) elemental profiles of a finished Ti-incorporating CZTS solar cell fabricated in accordance with the present principles.

Referring to FIG. 3, a graph of SIMS (secondary ion mass spectrometry) elemental profiles of a finished Ti-incorporating CZTS solar cell fabricated by methods described above is illustratively depicted. The graph plots intensity (counts per second (C/s)) versus time (seconds). As shown, a strong Ti feature 102 is formed at the CZTS/Mo interface that indicates the presence of Ti accumulation at the CZTS/Mo interface. Ti is uniformly doped throughout entire CZTS film with a pile-up feature 104 around the CdS emitter/ZnO interface.

Figure 4:
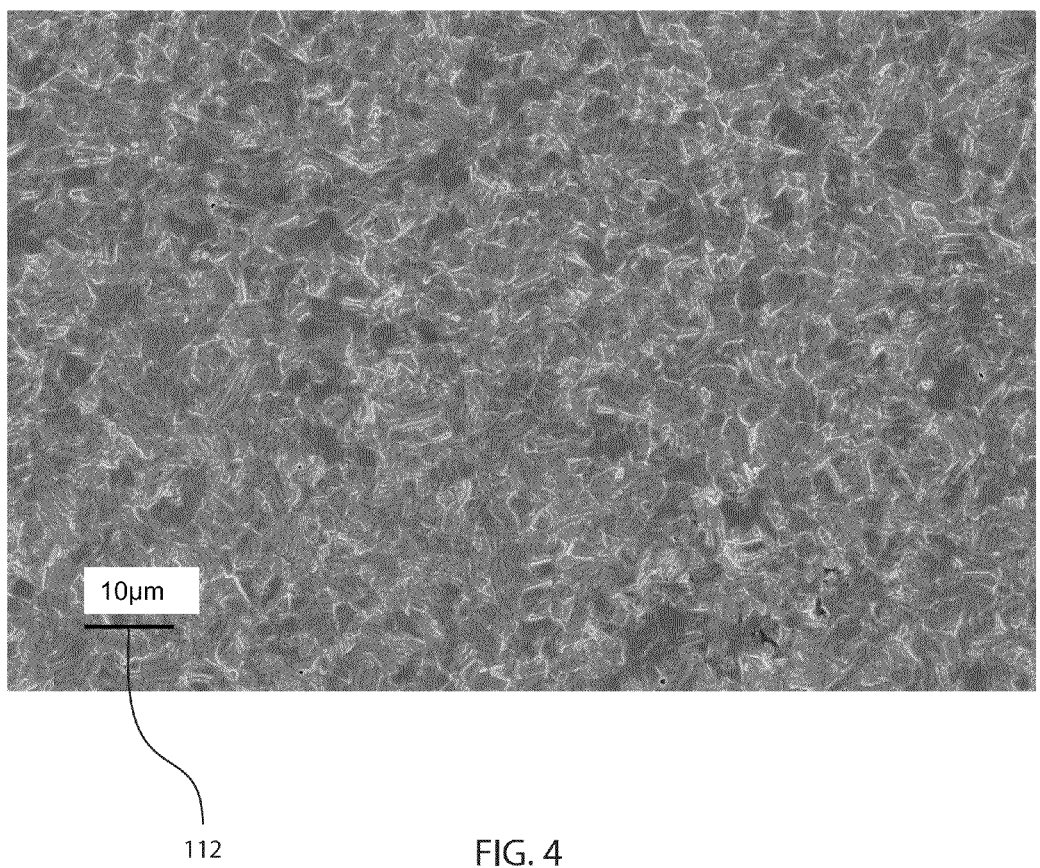
FIG. 4 is a scanning electron microscope (SEM) image showing a top view of a CZTS film on a Ti/Mo/substrate fabricated in accordance with the present principles.

Referring to FIG. 4, a scanning electron microscope (SEM) image shows a top view of a CZTS film on a Ti/Mo/substrate fabricated in accordance with the present principles. Micrometer-sized CZTS grains are uniformly distributed as indicated in the image. A 10-micron scale 112 is indicated in FIG. 4.

Figure 5:
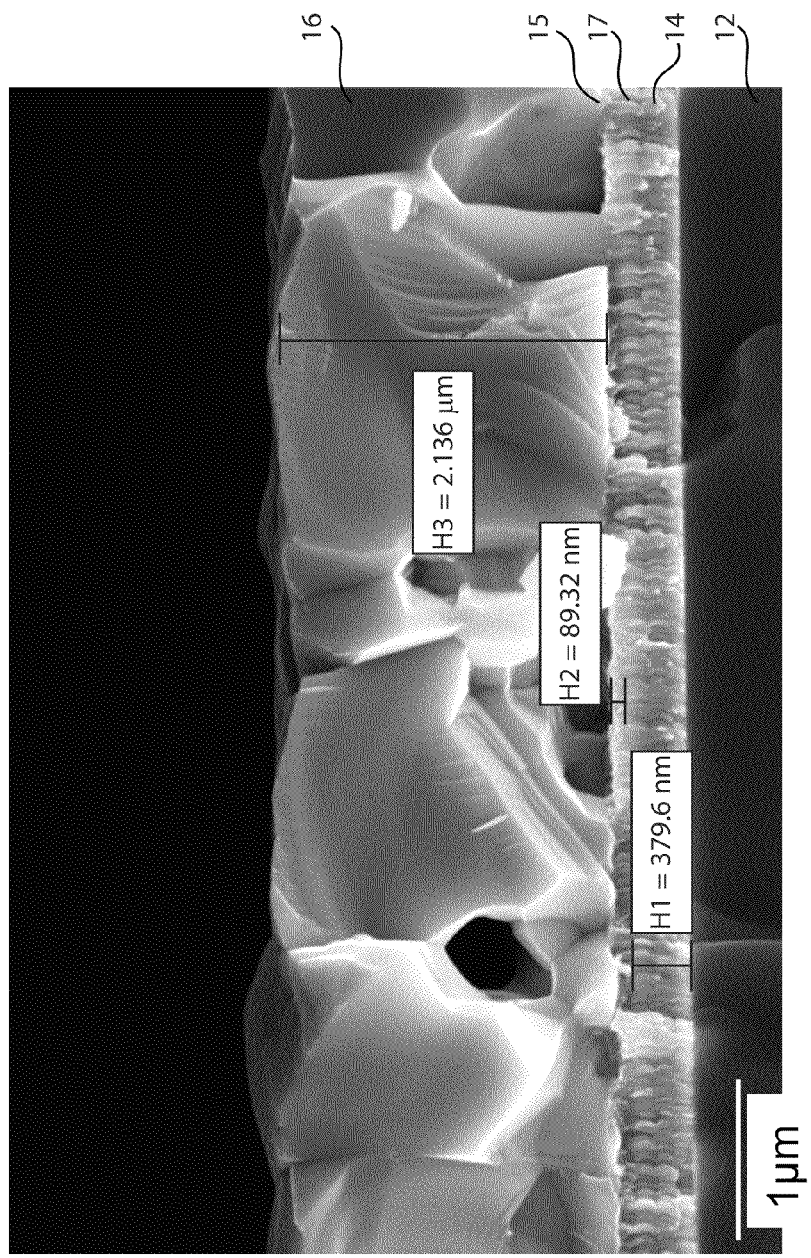
FIG. 5 is a cross-section SEM image of the CZTS film of FIG. 4 in accordance with the present principles.

Referring to FIG. 5, a cross-section SEM image of the CZTS film of FIG. 4 is shown. The thicknesses of the CZTS layer 16 and the Mo layer 14 are 2.136 microns and 379.6 nm, respectively. An 89.32 nm MoSe$_2$ layer 17 is formed during the annealing process. SIMS elemental profiles show that the Ti and MoSe$_2$ are chemically mixed after annealing.

Figure 6:
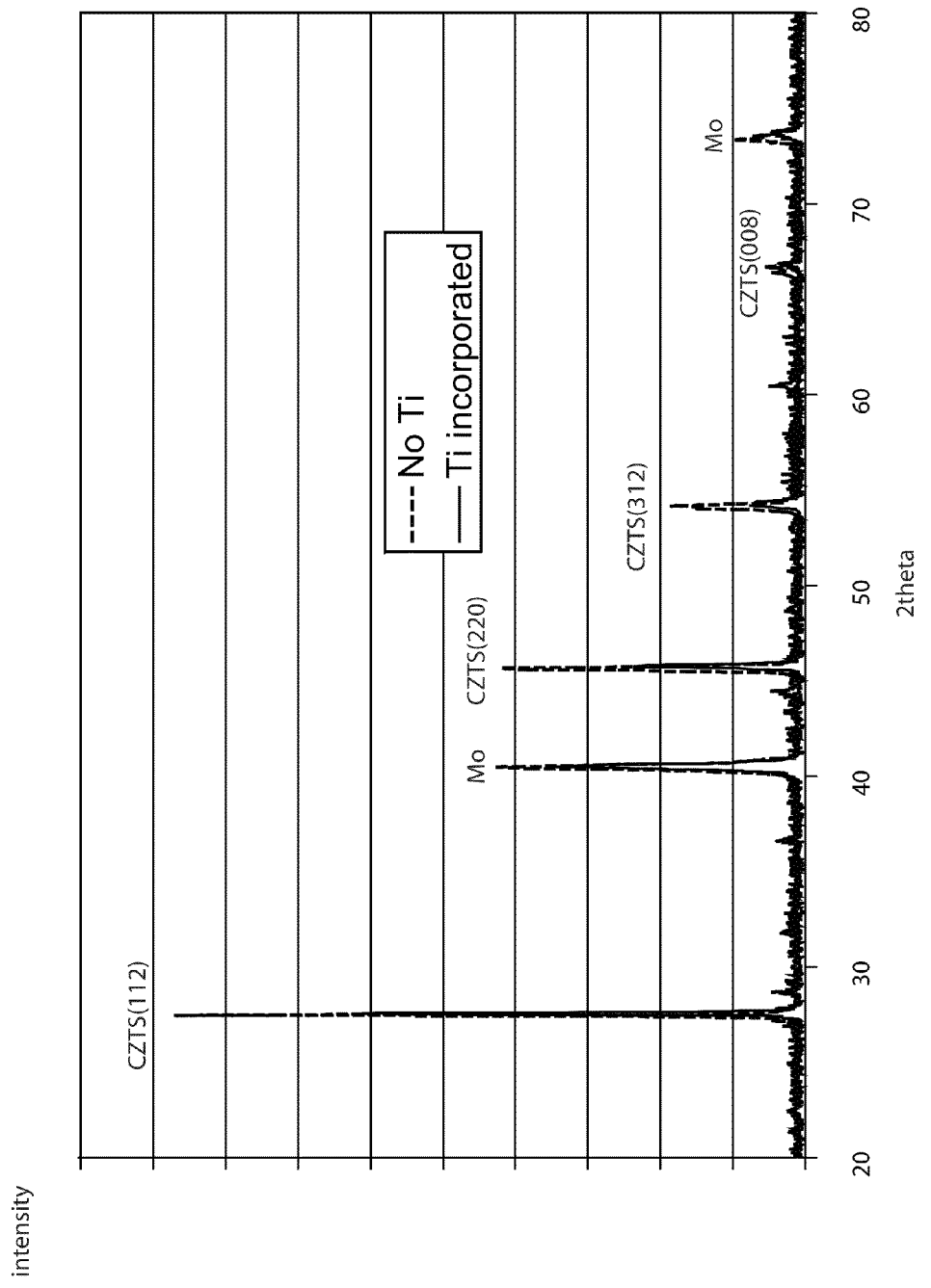
FIG. 6 shows X-ray diffraction patterns plotting intensity versus $2\theta$ (2 theta) for a CZTS film with Ti incorporated therein and a CZTS film with no-Ti incorporated therein.

Referring to FIG. 6, X-ray diffraction patterns plotting intensity versus 2θ (2 theta) are shown for a CZTS film with Ti incorporated therein and no-Ti incorporated therein. Both CZTS films show kesterite-type structures. No obvious structural differences were detected between these two CZTS films in the X-ray diffractions.

Figure 7:
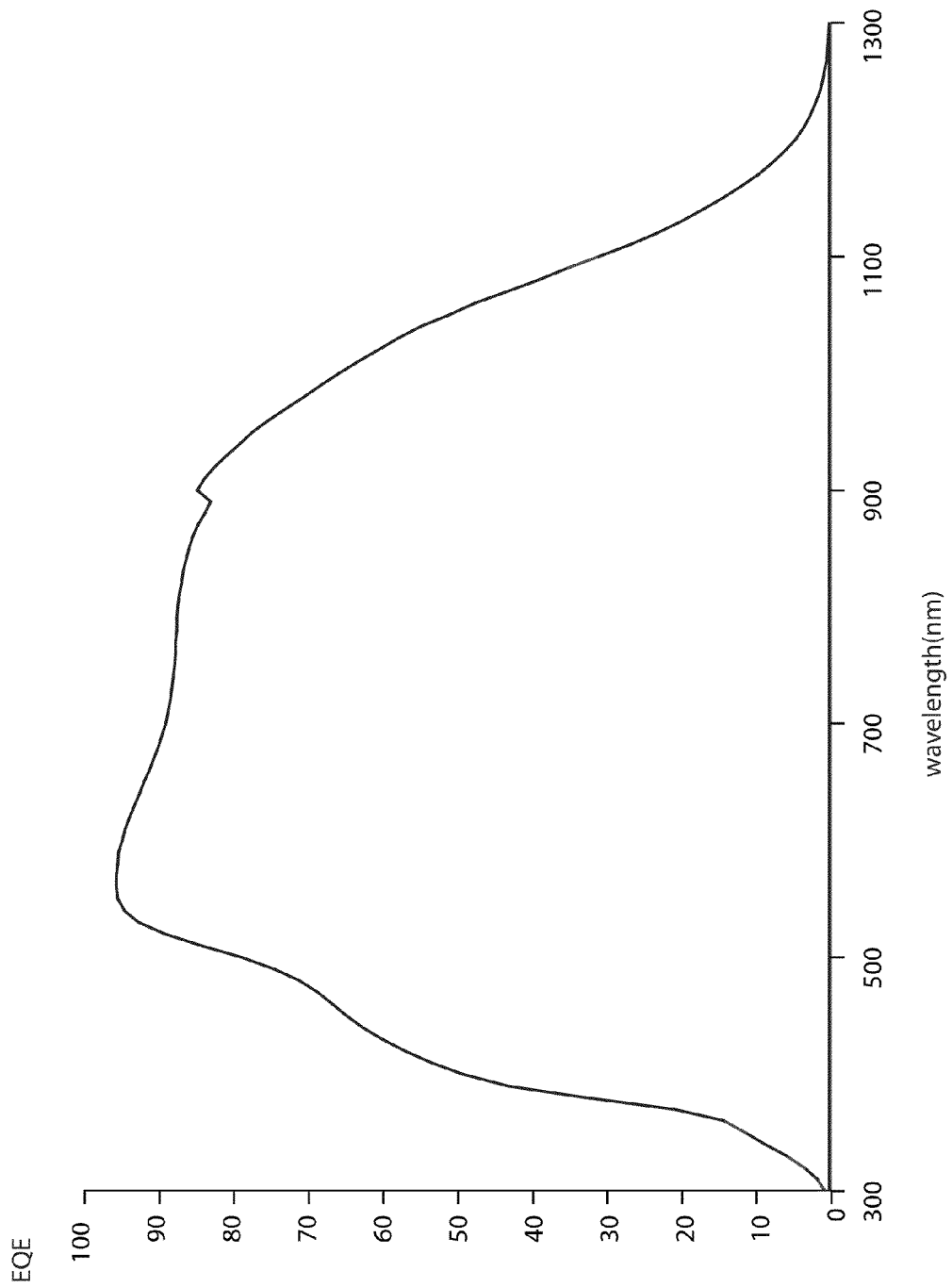
FIG. 7 is an external quantum efficiency (EQE) graph for a Ti-incorporated CZTS solar cell in accordance with the present principles.

Referring to FIG. 7, an external quantum efficiency (EQE) graph is shown for a Ti-incorporated CZTS solar cell. The maximum EQE is 96% for 570 nm wavelength light. The band gap determined at the absorption edge is 1.14 eV.

Figure 8:
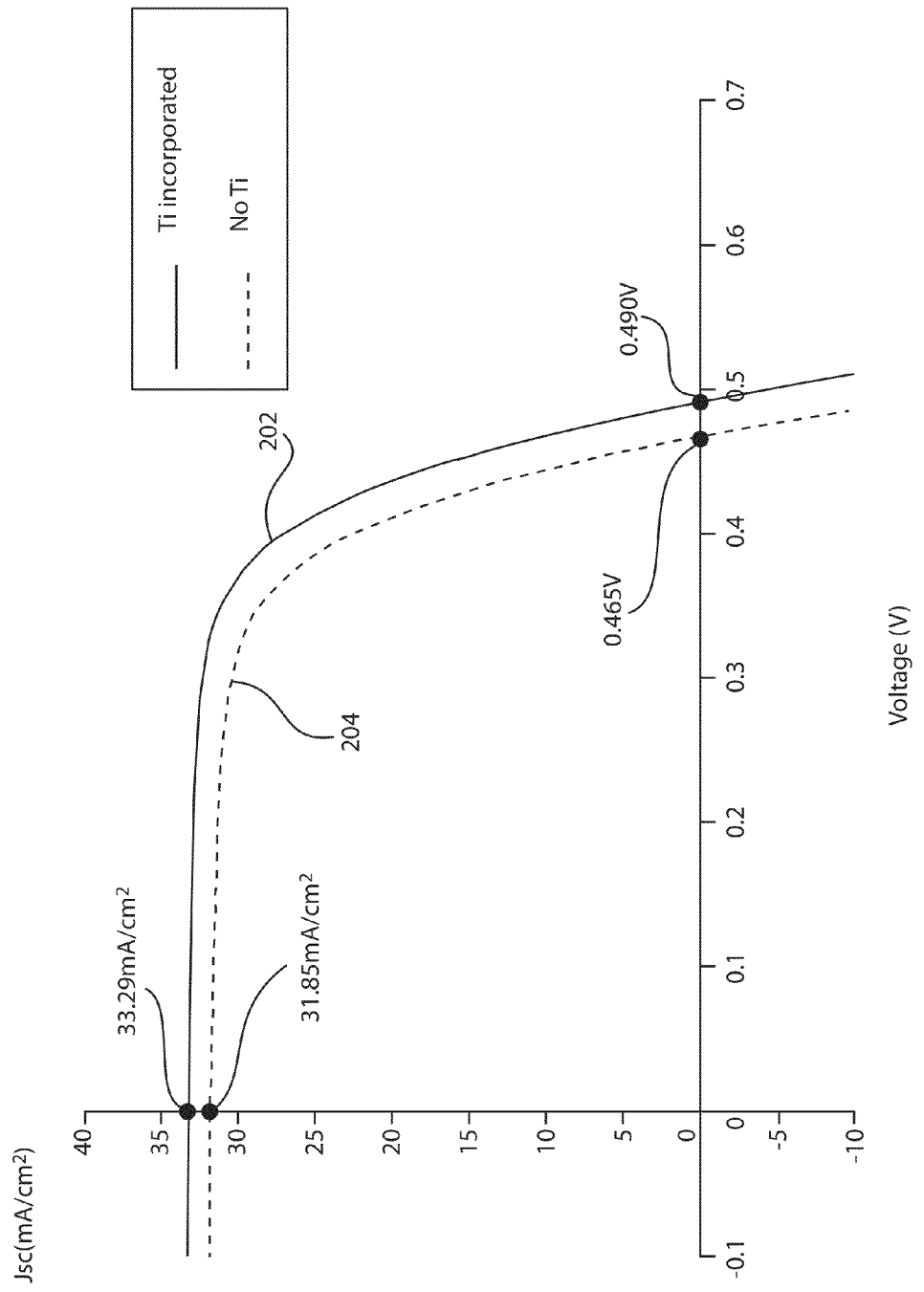
FIG. 8 is a current-voltage graph for a Ti-incorporated CZTS solar cell and for a CZTS solar cell without Ti.

Referring to FIG. 8, a current-voltage graph is shown for a Ti-incorporated CZTS solar cell 202 and a CZTS solar cell without Ti 204. The Ti-incorporated CZTS solar cell 202 has a 1.14 eV band gap while CZTS solar cell without Ti 204 has a 1.16 eV bandgap. In this example, due to the incorporation of Ti into the CZTS solar cell (202), the PCE rises to 11.14% as compared to 10.03% for the CZTS solar cell without Ti 204. The Ti incorporation into the CZTS not only boosts $V_{oc}$ but also improves the current collection, resulting in higher short circuit current ($J_{sc}$) and $V_{oc}$, which increase by 1.44 mA/cm$^2$ and 25 mV, respectively.

Figure 9:
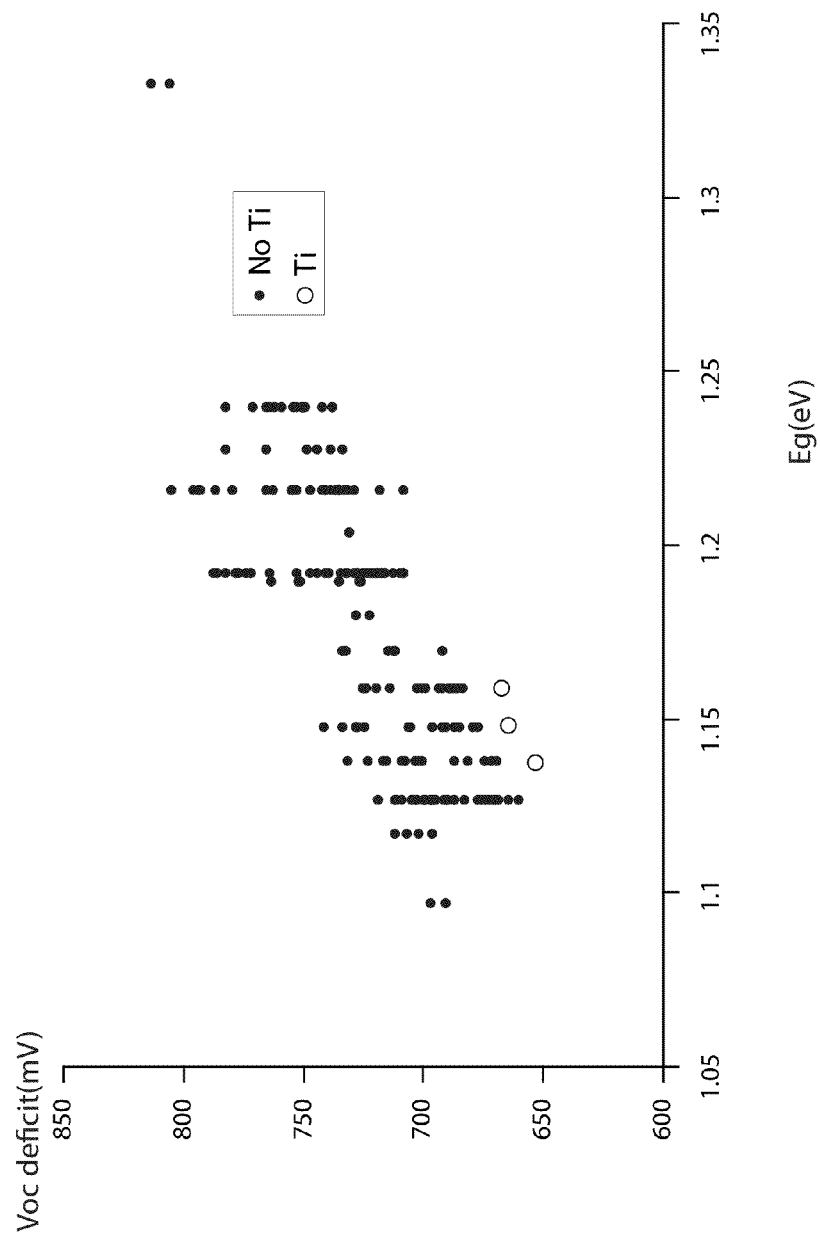
FIG. 9 is a diagram comparing $V_{oc}$ deficits of Ti-incorporated CZTS solar cells and no-Ti CZTS solar cells.

Referring to FIG. 9, a diagram is shown comparing the $V_{oc}$ deficits ($E_g/q - V_{oc}$) of Ti-incorporated CZTS solar cells and no-Ti CZTS solar cells. The graph shows $V_{oc}$ deficit (mV) versus energy gap (eV). The graph clearly demonstrates the benefit of Ti incorporation into CZTS from the aspect of $V_{oc}$ enhancement. The present embodiments have significant potential to reduce $V_{oc}$ deficit and push the efficiency of CZTS solar cells towards the SQ limit.

Figure 10:
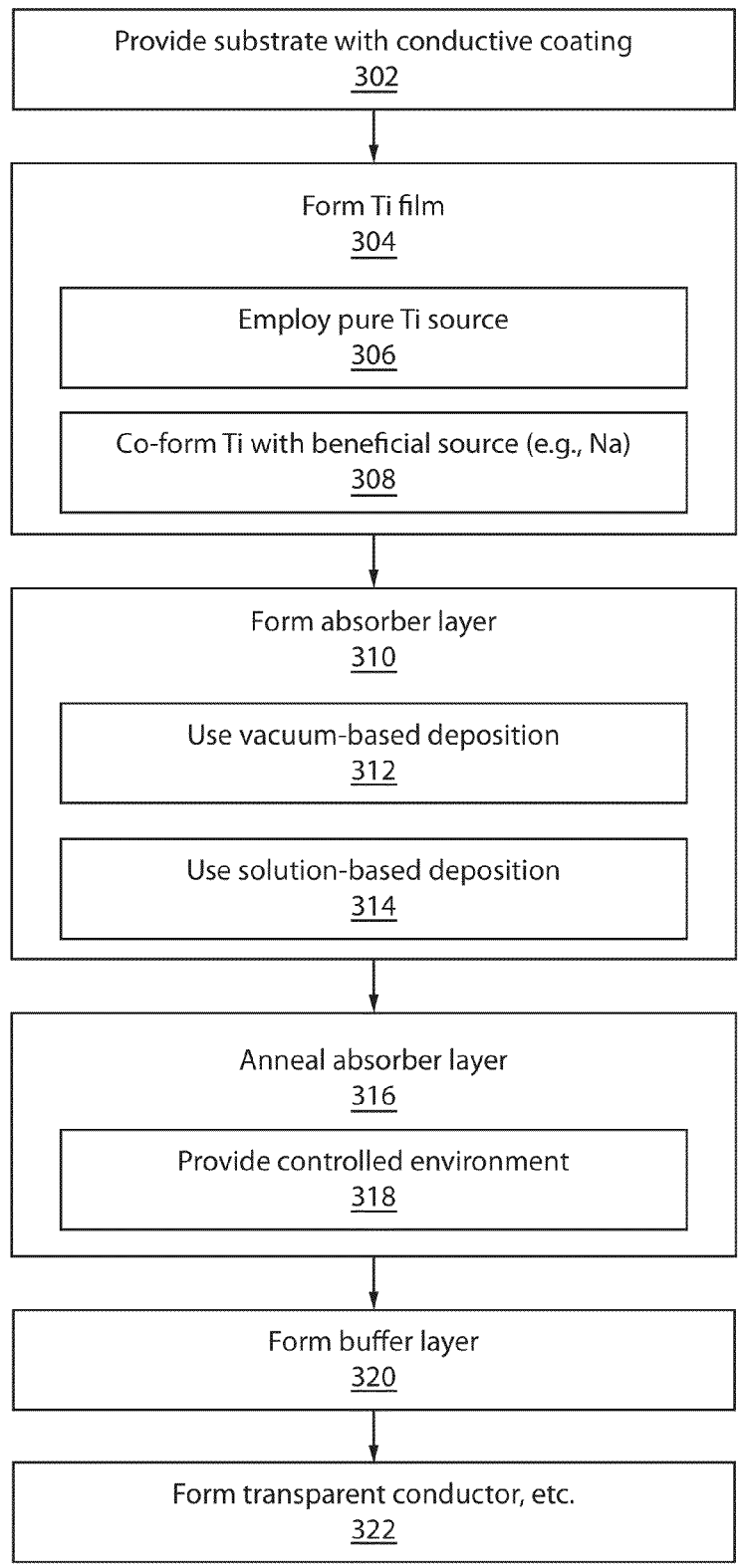
FIG. 10 is a block/flow diagram showing methods for fabricating a photovoltaic device in accordance with illustrative embodiments.
Figure 11:
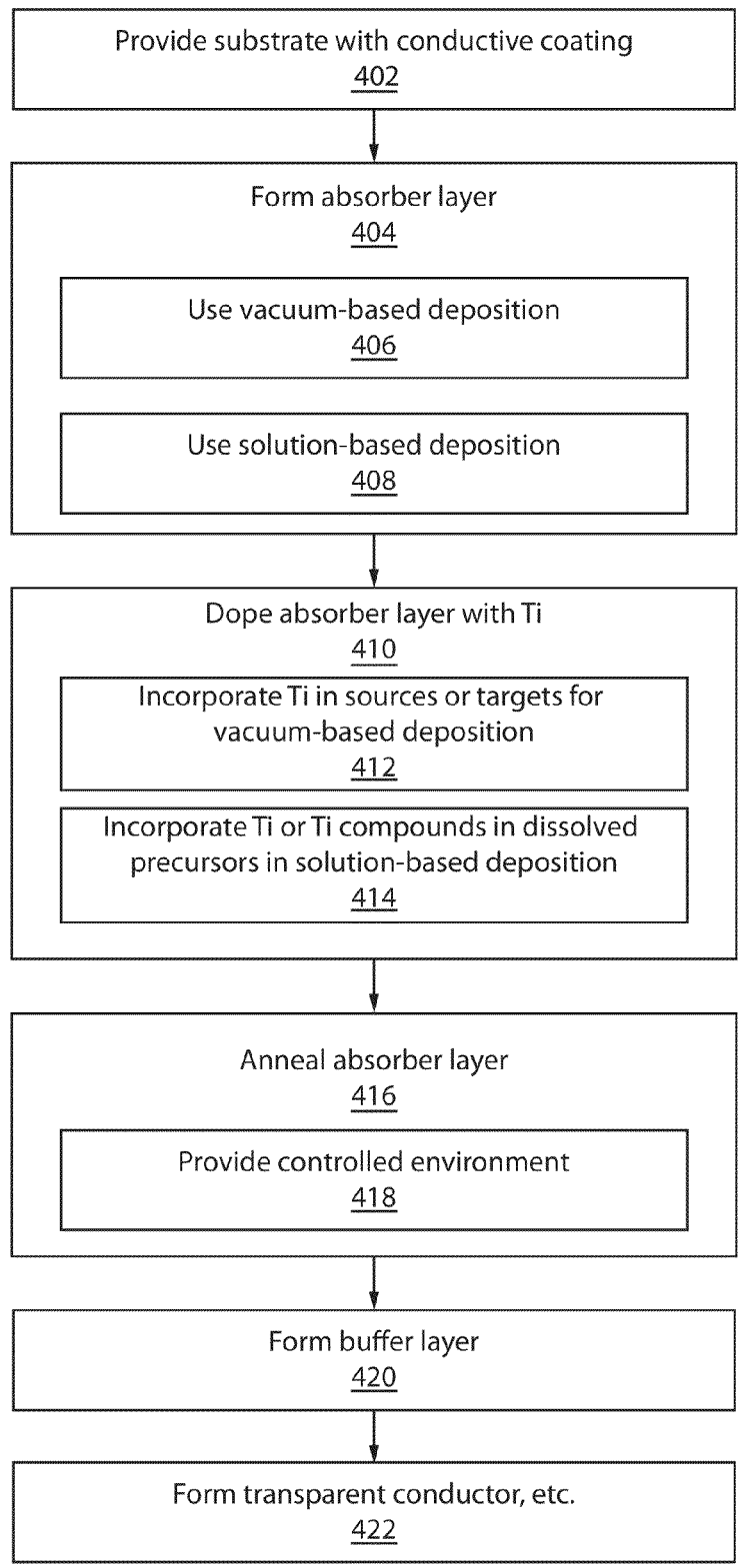
FIG. 11 is a block/flow diagram showing other methods for fabricating a photovoltaic device in accordance with illustrative embodiments.

Referring to FIGS. 10 and 11, it should also be noted that, in some implementations, the functions noted in the blocks may occur out of the order noted in FIGS. 10 and 11. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Referring to FIG. 10, methods for fabricating a photovoltaic device are illustratively shown. In block 302, a substrate is provided with a conductive layer formed thereon. In one example, the substrate includes glass, and the conductive layer may include Mo. Other materials may also be employed. In block 304, a film including titanium is formed on the conductive layer. In block 306, the film is formed from a titanium source that has a purity of 99% or greater. In block 308, the film is co-formed with an additional element source that includes beneficial elements such as sodium and/or antimony.

In block 310, an absorber layer is formed including a Cu—Zn—Sn containing chalcogenide compound with a kesterite structure of the formula: $Cu_{2-x}Zn_{1+y}Sn(S_{1-z}Se_z)_{4+q}$ wherein 0≤x≤1; 0≤y≤1; 0≤z≤1; −1≤q≤1 (CZTS) on the film.

In block 312, a vacuum-based deposition may be performed by one of co-evaporation, sputtering, laser ablation, flash evaporation, etc. In block 314, a solution-based deposition may be performed by one of a hydrazine-assisted solution, metal nanoparticles, binary chalcogenide nanoparticles, ternary chalcogenide nanoparticles, quaternary metal salt solutions, electrodeposition, a hydrothermal method, etc.

In block 316, the absorber layer is annealed to diffuse titanium therein and to recrystallize the CZTS material of the film. In block 318, the absorber layer is annealed in a controlled environment to produce a recrystallized CZTS film. The controlled environment includes one of a chemically inert environment and a reactive environment. The anneal includes heating the absorber layer to between about 300° C. and about 800° C.

In block 320, a buffer layer is formed on the absorber layer. In block 322, a transparent conductive layer is formed on the buffer layer. Metal contacts, anti-reflection coatings, etc. may also be formed.

Referring to FIG. 11, methods for fabricating a photovoltaic device are illustratively shown. In block 402, a substrate is provided with a conductive layer formed thereon. In one example, the substrate includes glass, and the conductive layer may include Mo. Other materials may also be employed. In block 404, an absorber layer is formed on the conductive layer including a Cu—Zn—Sn containing chalcogenide compound with a kesterite structure of the formula: $Cu_{2-x}Zn_{1+y}Sn(S_{1-z}Se_z)_{4+q}$ wherein 0≤x≤1; 0≤y≤1; 0≤z≤1; −1≤q≤1 (CZTS). In block 406, a vacuum-based deposition is performed by one of co-evaporation, sputtering, laser ablation, and flash evaporation. In block 408, a solution-based deposition is performed by one of a hydrazine-assisted solution, metal nanoparticles, binary chalcogenide nanoparticles, ternary chalcogenide nanoparticles, quaternary metal salt solutions, electrodeposition, and a hydrothermal method.

In block 410, the absorber layer is doped with titanium. In block 412, titanium is incorporated in one of source metal materials and target metal materials during the formation of the absorber layer in a vacuum-based deposition. In block 414, titanium is incorporated using one of titanium metal and titanium compounds dissolved into precursor solutions in a solution-based deposition.

In block 416, the absorber layer is annealed to recrystallize the CZTS material of the film. In block 418, the absorber layer is annealed in a controlled environment to produce a recrystallized CZTS film. The controlled environment includes one of a chemically inert environment and a reactive environment. The anneal includes heating the absorber layer to between about 300° C. and about 800° C.

In block 420, a buffer layer is formed on the absorber layer. In block 422, a transparent conductive layer is formed on the buffer layer. Metal contacts, anti-reflection coatings, etc. may also be formed.

Having described preferred embodiments for titanium incorporation into an absorber layer for a solar cell (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a photovoltaic device, comprising:
   forming a film including titanium on a conductive layer formed on a substrate;
   forming an absorber layer including a Cu—Zn—Sn containing chalcogenide compound with a kesterite structure of the formula: $Cu_{2-x}Zn_{1+y}Sn(S_{1-z}Se_z)_{4+q}$ wherein 0≤x≤1; 0≤y≤1; 0≤z≤1; −1≤q≤1 (CZTS) on the film;

annealing the absorber layer to diffuse titanium therein and to recrystallize the CZTS material of the film;
forming a buffer layer on the absorber layer; and
forming a transparent conductive layer on the buffer layer.

2. The method as recited in claim 1, wherein forming the absorber layer includes performing a vacuum-based deposition by one of co-evaporation, sputtering, laser ablation and flash evaporation.

3. The method as recited in claim 1, wherein forming the absorber layer includes performing a solution-based deposition by one of a hydrazine-assisted solution, metal nanoparticles, binary chalcogenide nanoparticles, ternary chalcogenide nanoparticles, quaternary metal salt solutions, electrodeposition and a hydrothermal method.

4. The method as recited in claim 1, wherein annealing the absorber layer includes annealing the absorber layer under a controlled environment to produce a recrystallized CZTS film, the controlled environment including one of a chemically inert environment and a reactive environment.

5. The method as recited in claim 1, wherein an atomic percentage of titanium included in the absorber layer ranges from about 0 to about 0.125.

6. The method as recited in claim 1, wherein forming the film includes forming the film from a titanium source that has a purity of 99% or greater.

7. The method as recited in claim 6, wherein forming the film includes co-forming the film from an additional element source.

8. The method as recited in claim 7, wherein the additional element source includes one of sodium and antimony.

9. A method for fabricating a photovoltaic device, comprising:
forming a conductive layer on a substrate;
forming an absorber layer including a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (CZTS) on the conductive layer;
doping the absorber layer with titanium;
annealing the absorber layer to recrystallize the CZTS material of the film;
forming a buffer layer on the absorber layer; and
forming a transparent conductive layer on the buffer layer.

10. The method as recited in claim 9, wherein forming the absorber layer includes performing a vacuum-based deposition by one of co-evaporation, sputtering, laser ablation and flash evaporation.

11. The method as recited in claim 9, wherein doping the absorber layer with titanium includes incorporating titanium in one of source metal materials and target metal materials during the step of forming the absorber layer in a vacuum-based deposition.

12. The method as recited in claim 9, wherein forming the absorber layer includes performing a solution-based deposition by one of a hydrazine-assisted solution, metal nanoparticles, binary chalcogenide nanoparticles, ternary chalcogenide nanoparticles, quaternary metal salt solutions, electrodeposition and a hydrothermal method.

13. The method as recited in claim 9, wherein doping the absorber layer with titanium includes incorporating titanium in one of titanium metal and titanium compounds dissolved into precursor solutions in a solution-based deposition.

14. The method as recited in claim 9, wherein annealing the absorber layer includes annealing the absorber layer under a controlled environment to produce a recrystallized CZTS film, the controlled environment including one of a chemically inert environment and a reactive environment.

15. The method as recited in claim 9, wherein an atomic percentage of titanium included in the absorber layer ranges from about 0 to about 0.125.

\* \* \* \* \*